US012593422B2

(12) United States Patent
Narasimhan et al.

(10) Patent No.: US 12,593,422 B2
(45) Date of Patent: Mar. 31, 2026

(54) HEATSINK WITH ADJUSTABLE FIN PITCH

(71) Applicant: NVIDIA CORPORATION, Santa Clara, CA (US)

(72) Inventors: Susheela Narasimhan, Fremont, CA (US); Michal L. Sabotta, Cypress, TX (US)

(73) Assignee: NVIDIA CORPORATION, Santa Clara, CA (US)

( * ) Notice: Subject to any disclaimer, the term of this patent is extended or adjusted under 35 U.S.C. 154(b) by 159 days.

(21) Appl. No.: 18/357,054

(22) Filed: Jul. 21, 2023

(65) Prior Publication Data

US 2023/0363104 A1 Nov. 9, 2023

Related U.S. Application Data

(62) Division of application No. 16/992,035, filed on Aug. 12, 2020, now Pat. No. 11,711,905.

(60) Provisional application No. 62/978,283, filed on Feb. 18, 2020.

(51) Int. Cl.
*H05K 7/20* (2006.01)

(52) U.S. Cl.
CPC ..... *H05K 7/20163* (2013.01); *H05K 7/20309* (2013.01); *H05K 7/20318* (2013.01); *H05K 7/20336* (2013.01); *H05K 7/20409* (2013.01)

(58) Field of Classification Search
CPC ..... G06F 1/20; H01L 23/3672; H01L 23/427; H05K 7/20163; H05K 7/20309; H05K 7/20318; H05K 7/20336; H05K 7/20409; H05K 7/208
See application file for complete search history.

(56) References Cited

U.S. PATENT DOCUMENTS

| | | | |
|---|---|---|---|
| 5,162,974 A | 11/1992 | Currie | |
| 5,651,414 A | 7/1997 | Suzuki et al. | |
| 5,960,865 A | 10/1999 | Costa et al. | |
| 6,118,656 A | 9/2000 | Wang | |

(Continued)

FOREIGN PATENT DOCUMENTS

| | | |
|---|---|---|
| CN | 103036394 A | 4/2013 |
| CN | 106954366 B | 4/2020 |

(Continued)

OTHER PUBLICATIONS

Kim et al., Scroll heat sink: A novel heat sink with the moving fins inserted between the cooling fins, May 5, 2008, International Journal of Heat and Mass Transfer, p. 3268-3274. (Year: 2008).*

(Continued)

*Primary Examiner* — Kidest Worku
(74) *Attorney, Agent, or Firm* — Artegis Law Group, LLP

(57) ABSTRACT

An apparatus includes at least one heat pipe that is adapted to be thermally coupled to an integrated circuit and has an evaporator portion and a first condenser portion, wherein the first condenser portion extends away from the evaporator portion; a first plurality of cooling fins that is attached to the first condenser portion; a first movable support that is thermally coupled to the first condenser portion and is configured to move a second plurality of cooling fins relative to the first plurality of cooling fins; and the second plurality of cooling fins, which is attached to the first movable support.

9 Claims, 8 Drawing Sheets

(56) References Cited

U.S. PATENT DOCUMENTS

| | | | |
|---|---|---|---|
| 6,226,178 B1 | 5/2001 | Broder et al. | |
| 6,226,184 B1* | 5/2001 | Stolz | H05K 7/2049 |
| | | | 257/E23.09 |
| 6,608,752 B2 | 8/2003 | Morris et al. | |
| 6,967,845 B2 | 11/2005 | Chiang et al. | |
| 7,012,807 B2 | 3/2006 | Chu et al. | |
| 7,019,974 B2 | 3/2006 | Lee et al. | |
| 7,327,568 B2 | 2/2008 | Lin | |
| 7,327,576 B2 | 2/2008 | Lee et al. | |
| 7,330,353 B2 | 2/2008 | Gilliland et al. | |
| 7,477,515 B2 | 1/2009 | Tsai et al. | |
| 7,515,423 B2 | 4/2009 | Peng et al. | |
| 7,542,293 B2 | 6/2009 | Zhao et al. | |
| 7,755,897 B2 | 7/2010 | Chen et al. | |
| 7,755,900 B2 | 7/2010 | Cheng | |
| 7,911,781 B2 | 3/2011 | Chao et al. | |
| 7,952,872 B1 | 5/2011 | Hata et al. | |
| 8,240,360 B2 | 8/2012 | Bang et al. | |
| 8,248,794 B2 | 8/2012 | Li et al. | |
| 8,395,898 B1 | 3/2013 | Chamseddine et al. | |
| 8,493,737 B2 | 7/2013 | Abe et al. | |
| 8,804,336 B2 | 8/2014 | Lee | |
| 8,861,203 B2 | 10/2014 | Fang | |
| 9,625,220 B1 | 4/2017 | Ahbel et al. | |
| 9,644,907 B1 | 5/2017 | Ahbel et al. | |
| 10,219,365 B1 | 2/2019 | Chen et al. | |
| 10,247,489 B2 | 4/2019 | Ahbel et al. | |
| 2004/0037039 A1 | 2/2004 | Shimura et al. | |
| 2005/0248918 A1 | 11/2005 | Lin | |
| 2006/0098414 A1 | 5/2006 | Huang | |
| 2006/0139880 A1* | 6/2006 | Tate | G06F 1/20 |
| | | | 257/E23.088 |
| 2006/0178786 A1* | 8/2006 | Bhagwath | G05D 23/1917 |
| | | | 700/300 |
| 2006/0291172 A1 | 12/2006 | Lee et al. | |
| 2007/0147006 A1 | 6/2007 | Peng | |
| 2009/0040722 A1 | 2/2009 | Chu et al. | |
| 2010/0018669 A1 | 1/2010 | Chen | |
| 2011/0073283 A1 | 3/2011 | Huang | |
| 2011/0127012 A1 | 6/2011 | Ma et al. | |
| 2012/0160455 A1 | 6/2012 | Liu et al. | |
| 2013/0138262 A1 | 5/2013 | Busch et al. | |
| 2014/0057770 A1* | 2/2014 | Holmes | B04B 15/02 |
| | | | 494/10 |
| 2014/0360696 A1 | 12/2014 | Alshinnawi et al. | |
| 2015/0029658 A1* | 1/2015 | Yairi | H05K 7/20272 |
| | | | 361/679.47 |
| 2015/0098176 A1* | 4/2015 | Dean | G06F 1/185 |
| | | | 361/679.54 |
| 2015/0247686 A1 | 9/2015 | Akalanne | |
| 2018/0051940 A1* | 2/2018 | Bodenweber | H01L 23/3672 |
| 2020/0020478 A1 | 1/2020 | Nishimura et al. | |
| 2020/0217599 A1 | 7/2020 | Narasimhan et al. | |
| 2021/0105913 A1 | 4/2021 | Au et al. | |

FOREIGN PATENT DOCUMENTS

| | | | |
|---|---|---|---|
| TW | 200907651 A | 2/2009 | |
| TW | I451256 B * | 9/2014 | H05K 7/20 |

OTHER PUBLICATIONS

Honggang et al., "Investigation of Heat Transfer Enhancement for a Heat-pipe Heat Exchanger Used for Chips", Science Technology and Engineering, vol. 6, No. 11, Jun. 15, 2006, 6 pages.

* cited by examiner

800

HEATSINK WITH ADJUSTABLE FIN PITCH

CROSS-REFERENCE TO RELATED APPLICATIONS

This application is a divisional of the co-pending U.S. patent application titled, "HEAT SINK WITH ADJUSTABLE FIN PITCH", filed on Aug. 12, 2020, and having Ser. No. 16/992,035, which claims the priority benefit of United States provisional patent application titled, "HEATSINK WITH ADJUSTABLE FIN PITCH", filed Feb. 18, 2020, and having Ser. No. 62/978,283. The subject matter of these related applications is hereby incorporated herein by reference.

BACKGROUND

Field of the Various Embodiments

The various embodiments relate generally to computer systems and computer architecture and, more specifically, to a heat sink with adjustable fin pitch.

Description of the Related Art

In modern computing systems, central processing units (CPUs), graphics processing units (GPUs), and other integrated circuits (ICs) generate significant quantities of heat during use. This heat needs to be removed for the proper operation of the integrated circuit and computing system. For example, a single high-power chip, such as a CPU or GPU, can generate hundreds of watts of heat during operation, and, if this heat is not efficiently removed, the temperature of the chip can increase to a point at which the chip is at risk of being damaged. To prevent thermal damage during operation, many systems implement clock-speed throttling when the operating temperature of the processor exceeds a certain threshold. Thus, in these systems, the processing speed of the high-power chip is constrained by both the chip design and how effectively heat is removed from the chip.

To reduce the impact that thermal constraints have on high-power chip performance, heat exchangers are often employed that allow high-power chips to operate at greater processing speeds and generate greater amounts of heat. Heat exchangers are designed to efficiently transfer heat from a chip to ambient air, and the air then carries the heat away from the chip. Heat exchangers can include passive devices, such as heat sinks, or more complex heat-transfer devices, such as heat pipes. Heat sinks generally include an array of fins that increase the effective surface area of the chip exposed to ambient air, while heat pipes rely on phase transition (e.g., evaporation of a liquid) to efficiently transfer heat between two solid interfaces. In some instances, heat pipes are used in conjunction with heat sinks to increase the amount of heat that can be removed from a high-power chip.

To further facilitate the cooling of high-power chips, computing systems typically also include one or more cooling fans that are arranged to either push or pull air across the heat exchangers coupled to the high-power chips. Because cooling fans typically generate unidirectional airflow inside a computer system, some high-power chips and heat-generating devices usually are disposed downstream of other high-power chips or heat-generating devices in a given computing device. As cooling air passes over the upstream devices, those devices add heat to the cooling air, which results in the downstream devices being cooled by substantially warmer air than the upstream devices. Consequently, the downstream devices tend to "run hotter" than the upstream devices, which can limit the processing speeds of the downstream devices.

One approach for addressing the above phenomenon is to couple less efficient heat exchangers to the upstream devices within a computing devices. For example, heat exchangers having fewer cooling fins could be coupled to the upstream devices within a given computing device. With such an approach, less heat is added to the cooling air as the air passes over the upstream devices, which results in more effective cooling of the downstream devices when the cooling air passes over the downstream devices.

One drawback to such an approach is that processor boards configured in this way are compatible with a single direction of airflow, and have optimal performance when installed to receive airflow in that direction. Thus, the flexibility of the placement of such processor boards is limited. Further, for certain computer systems, e.g., cloud-computing servers, the direction of airflow through the computer system can vary depending on site-specific factors, such as the layout design of the computer system. Thus, when employed in a cloud-computing server, two configurations of the same processor board may be manufactured, one for applications in which cooling airflow passes through the computer system in one direction and another for applications in which cooling airflow passes through the computer system in the opposite direction.

As the foregoing illustrates, what is needed in the art is a more effective way to cool electronics devices within computer systems.

SUMMARY

An apparatus includes at least one heat pipe that is adapted to be thermally coupled to an integrated circuit and has an evaporator portion and a first condenser portion, wherein the first condenser portion extends away from the evaporator portion; a first plurality of cooling fins that is attached to the first condenser portion; a first movable support that is thermally coupled to the first condenser portion and is configured to move a second plurality of cooling fins relative to the first plurality of cooling fins; and the second plurality of cooling fins, which is attached to the first movable support.

At least one technical advantage of the disclosed approach relative to the prior art is that the disclosed approach results in more efficient cooling of an electronic device that is disposed within a computer system downstream of an adjustable heat sink. More specifically, when the adjustable heat sink is coupled to an upstream electronic device within the computer system, the cooling efficiency of the adjustable heat sink can be reduced, causing the temperature of cooling air exiting the adjustable heat sink to decrease. As that relatively cooler air passes over a downstream electronic device within the computer system, the downstream device is cooled relatively more effectively. Thus, the adjustable heat sink can selectively modify the efficiency of cooling of the upstream electronic device relative to that of the downstream electronic device. Since the adjustable heat sink can be employed in a computer system as both an upstream heat sink and as a downstream heat sink, the manufacturing process for the computer system is simplified. Further, in operation, the adjustable heat sink provides flexibility in the placement or orientation within a computer system of a processor board that includes upstream and downstream heat-generating electronic devices. These technical advantages provide one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
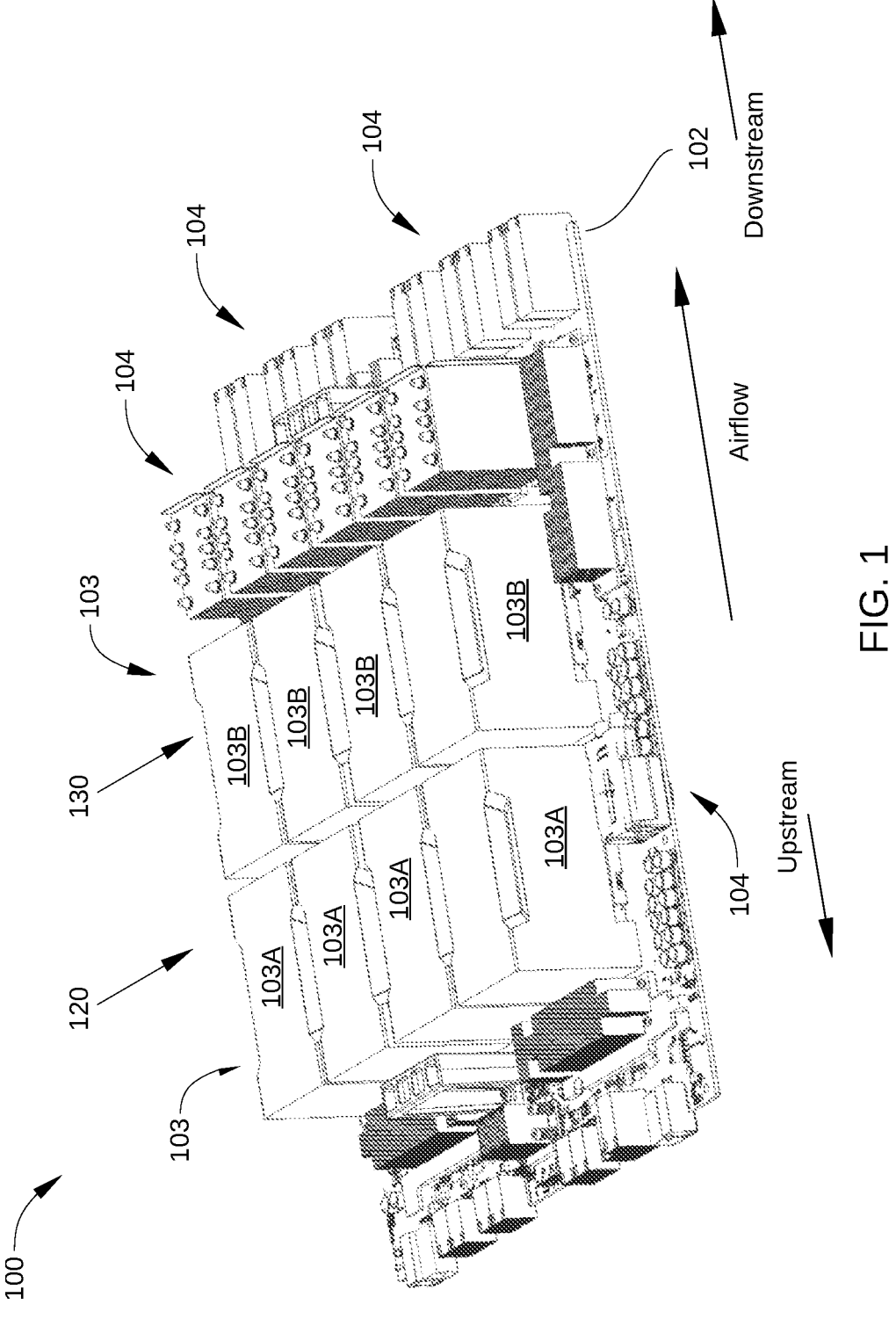
FIG. 1 is a perspective view of a computer system configured to implement one or more aspects of the various embodiments.

In the following description, numerous specific details are set forth to provide a more thorough understanding of the various embodiments. However, it will be apparent to one of skilled in the art that the inventive concepts may be practiced without one or more of these specific details.
Computer System with Adjustable Heat Sink FIG. 1 is a perspective view of a computer system 100, according to various embodiments. Computer system 100 is a computing device or a portion of a computing device, such as a server machine, personal computer, laptop, tablet, video game console, personal digital assistant, mobile phone, mobile device or any other electronic device suitable for practicing the embodiments herein. In the embodiment illustrated in FIG. 1, computer system 100 is depicted as a server board of a distributed-computing system or cloud-computing system that includes multiple integrated circuits (ICs) mounted on a single printed circuit board (PCB) 102. As such, computer system 100 is configured to be installed with a plurality of other server boards in, for example, a server rack. However, FIG. 1 in no way limits or is intended to limit the scope of the embodiments described herein, and computer system 100 can be any other computing system that includes multiple ICs that are each coupled to a respective heat exchanger 103. In such embodiments, some or all of the multiple ICs are coupled to a respective heat exchanger 103. In addition to the multiple ICs, which are not visible in FIG. 1, computer system 100 can also include various other electronic components 104 mounted on PCB 102. In the example of FIG. 1, the direction of airflow is from left to right, but in other embodiments, the direction of airflow may be in a different direction.

As shown, computer system 100 can include two or more rows of ICs and associated heat exchangers 103. Further, in some embodiments, cooling air is directed by one or more fans (not shown) that either push or pull air in one direction across computer system 100 and heat exchangers 103. Thus, the flow of cooling air (or other cooling fluid) over computer system 100 is unidirectional and flows sequentially through a first row 120 of "upstream" heat exchangers 103A of computer system 100 and then through a second row 130 of "downstream" heat exchangers 103B of computer system 100. As a result, upstream heat exchangers 103A in first row 120 receive cooling air (or other cooling fluid) before downstream heat exchangers 103B in second row 130 receive the cooling air (or other cooling fluid).

Since upstream heat exchangers 103A receive the airflow before downstream heat exchangers 103B, the temperature of the cooling airflow received by upstream heat exchangers 103A is typically lower than the temperature of the cooling airflow received by downstream heat exchangers 103B. In general, heat transfer from a cooling fluid when at a lower temperature is more efficient than heat transfer from the cooling fluid when at a higher temperature. Thus, heat transfer from downstream heat exchangers 103B is generally more difficult than from upstream heat exchangers 103A. For example, when upstream heat exchangers 103A and downstream heat exchangers 103B have identical configurations, heat transfer generally occurs at a higher rate from upstream heat exchangers 103A. As a result, the ICs cooled by downstream heat exchangers 103B tend to operate at higher temperatures than the ICs cooled by upstream heat exchangers 103A.

According to various embodiments, an adjustable heat sink that has an adjustable and/or variable fin pitch can be employed in computer system 100 both upstream head exchangers 103A and downstream heat exchangers 103B. Advantageously, a single adjustable heat sink can be manufactured for use in computer system 100 instead of a heat sink with an upstream configuration and heat sink with a downstream configuration, which reduces manufacturing costs and complexity. Further, in operation after manufacture, the fin pitch of the herein-described adjustable heat sink can be changed depending on whether the adjustable heat sink is used in an upstream heat exchanger or a downstream heat exchanger. Thus, flexibility in terms of the placement or orientation of computer system 100 within a larger system is provided. One such embodiment is illustrated in FIG. 2.

Figure 2:
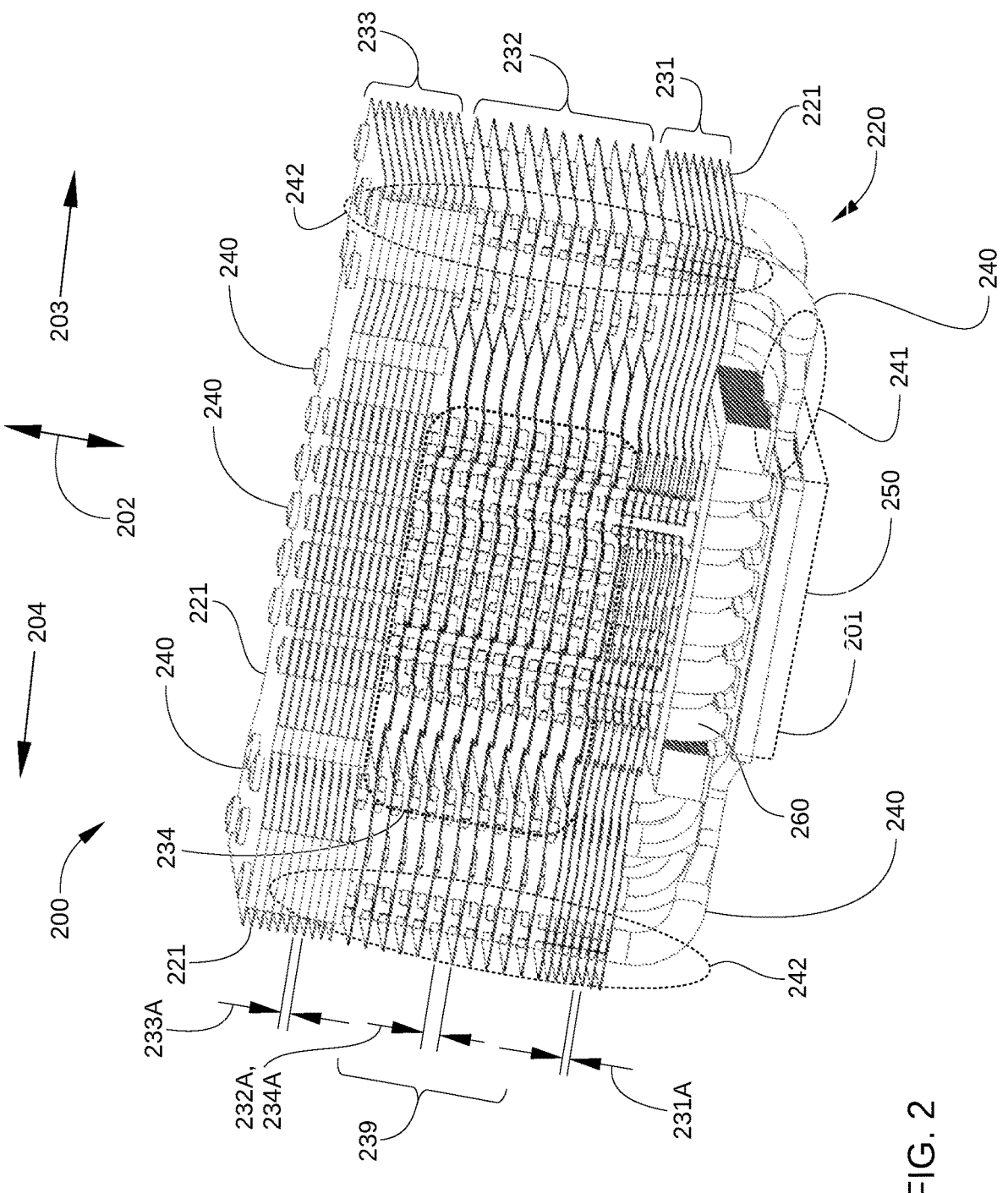
FIG. 2 is a perspective view of a heat exchanger that can be implemented in the computer system of FIG. 1, according to various embodiments.

FIG. 2 is a perspective view of a heat exchanger 200 that can be implemented in computer system 100, according to various embodiments. Heat exchanger 200 is a heat exchanger for an IC 201, and can be employed in computer system 100 of FIG. 1 as one or more of upstream heat exchangers 103A and as one or more of downstream heat exchangers 103B. Heat exchanger 200 includes one or more heat pipes 240 an adjustable heat sink 220 with a plurality of cooling fins 221. In the embodiment illustrated in FIG. 2, the one or more heat pipes 240 are thermally coupled to IC 201 and to cooling fins 221. Together, heat exchanger 200 and IC 201 form an electronic device that can be mounted on a PCB (not shown), such as PCB 102 in FIG. 1.

In some embodiments, IC 201 includes a single microchip, such as a graphics processing unit (GPU) or central-processing unit (CPU). Alternatively, in some embodiments IC 201 includes multiple microchips, such as a processor die and one or more stacks of memory dies that are all mounted on a common packaging substrate. In such embodiments, the packaging substrate can be configured for mounting IC onto a PCB (not shown), for example via solder balls (not shown). In addition, in such embodiments, IC 201 may include a package lid, which protects the processor die and the one or more stacks of memory dies from physical damage, but also increases thermal resistance associated with the packaging of IC 201. Further, in some multi-microchip embodiments, IC 201 can include other configurations of chips, such as a system-on-chip (SoC) configuration.

Heat pipes 240 are sealed vessels, such as copper tubes, that include an evaporative working fluid (not shown), such as water or alcohol. Heat pipes 240 efficiently transfer heat, through a combination of evaporation and condensation, from IC 201 to cooling fins 221 and on to cooling air (or any other cooling fluid) that passes over cooling fins 221. More specifically, in heat pipes 240, evaporation of the working fluid into a vapor takes place in an evaporator portion 241 of each heat pipe 240, while condensation of the working fluid takes place in one or more condenser portions 242. Each evaporator portion 241 is coupled to a surface from which thermal energy is to be removed, and each condenser portion 242 extends away from the surface from which the thermal energy is to be removed. In the embodiment illustrated in FIG. 2, each heat pipe 240 includes two condenser portions 242, but in other embodiments, each heat pipe 240 can include more than or fewer than two condenser portions 242. Condensed working fluid from condenser portions 242 flows to a corresponding evaporator portion 241, where thermal energy from IC 201 is absorbed and the working fluid vaporizes. The vapor then moves to condenser portions 242 and condenses in the condenser portion 242, releasing latent heat. In some embodiments, each heat pipe 240 also includes a wicking structure or material (not shown) on some or all inner surfaces, to facilitate the return of condensed cooling liquid to the evaporator portion 241 of the heat pipe 240.

In the embodiment illustrated, heat pipes 240 are mounted on a metallic plate 250, such as a copper or aluminum plate, that is thermally coupled to IC 201. In such embodiments, metallic plate 250 can be thermally coupled to a surface of IC 201 via a thermal interface material (TIM), for example a highly thermally conductive paste. In the embodiment illustrated in FIG. 2, metallic plate 250 spreads heat over a surface area that is greater than that of IC 201. As a result, a larger number of heat pipes 240 can be thermally coupled to IC 201 on metallic plate 250 than when directly attached to IC 201.

Cooling fins 221 can be any material that conducts heat efficiently, such as copper or aluminum. Cooling fins 221 are oriented to allow a cooling fluid (referred to herein as "cooling air") to flow in either of airflow directions 203 or 204 between cooling fins 221. The cooling air flowing between cooling fins 221 also flows across condenser portions 242 of heat pipes 240.

According to various embodiments, cooling fins 221 include multiple groups of cooling fins, where at least one group of cooling fins is coupled to one or more of heat pipes 240 and at least one group of cooling fins is coupled to a movable support 260. In the embodiment illustrated in FIG. 2, a first group 231 of cooling fins 221 is coupled to condenser portions 242 of heat pipes 240 proximate to evaporator portions 241, a third group 233 of cooling fins 221 is coupled to condenser portions 242 of heat pipes 240 distal to evaporator portions 241, and a second group 232 of cooling fins 221 is coupled to evaporator portions 241 and is disposed between first group 231 and third group 233. In addition, a fourth group 234 of cooling fins 221 is coupled to movable support 260 and is disposed between first group 231 and third group 233. The cooling fins of first group 231, second group 232, and third group 233 are fixed in position, i.e., stationary. By contrast, the cooling fins of fourth group 234 are adjustable, in that the cooling fins of fourth group 234 can be moved in a vertical direction 202 by movable support 260.

The cooling fins of first group 231 are configured with a fixed fin pitch 231A, the cooling fins of second group 232 are configured with a fixed fin pitch 232A, the cooling fins of third group 233 are configured with a fixed fin pitch 233A, and the cooling fins of fourth group 234 are configured with a fixed fin pitch 234A. In the embodiment illustrated in FIG. 2, fixed fin pitch 232A and fixed fin pitch 234A are equal and are greater than fixed fin pitch 231A and fixed fin pitch 233A. In other embodiments, fixed fin pitch 231A and fixed fin pitch 233A can be greater than fixed fin pitch 232A and fixed fin pitch 234A.

As shown, the cooling fins of fourth group 234 are interleaved between at least a portion of the stationary cooling fins of second group 232. Thus, cooling fins of fourth group 234 alternate in vertical direction 202 with cooling fins of second group 232, so that each adjustable cooling fin is placed between two corresponding stationary cooling fins. Consequently, the movement in vertical direction 202 of the cooling fins of fourth group 234 can change the effective fin pitch, and therefore the cooling efficiency, of a center region 239 of heat exchanger 200.

In operation, the cooling efficiency of heat exchanger 200 is adjusted by changing the position of movable support 260 in vertical direction 202. For example, to reduce the cooling efficiency of heat exchanger 200, movable support 260 is positioned so that the cooling fins of fourth group 234, which are coupled to movable support 260, are each close to or in contact with a corresponding stationary cooling fin of second group 232. Conversely, as movable support 260 is moved in vertical direction 202 so that the cooling fins of fourth group 234 are moved away from the corresponding stationary cooling fin of second group 232, the cooling efficiency of heat exchanger 200 is increased. One embodiment of movable support 260 is described below in conjunction with FIG. 3.

Figure 3:
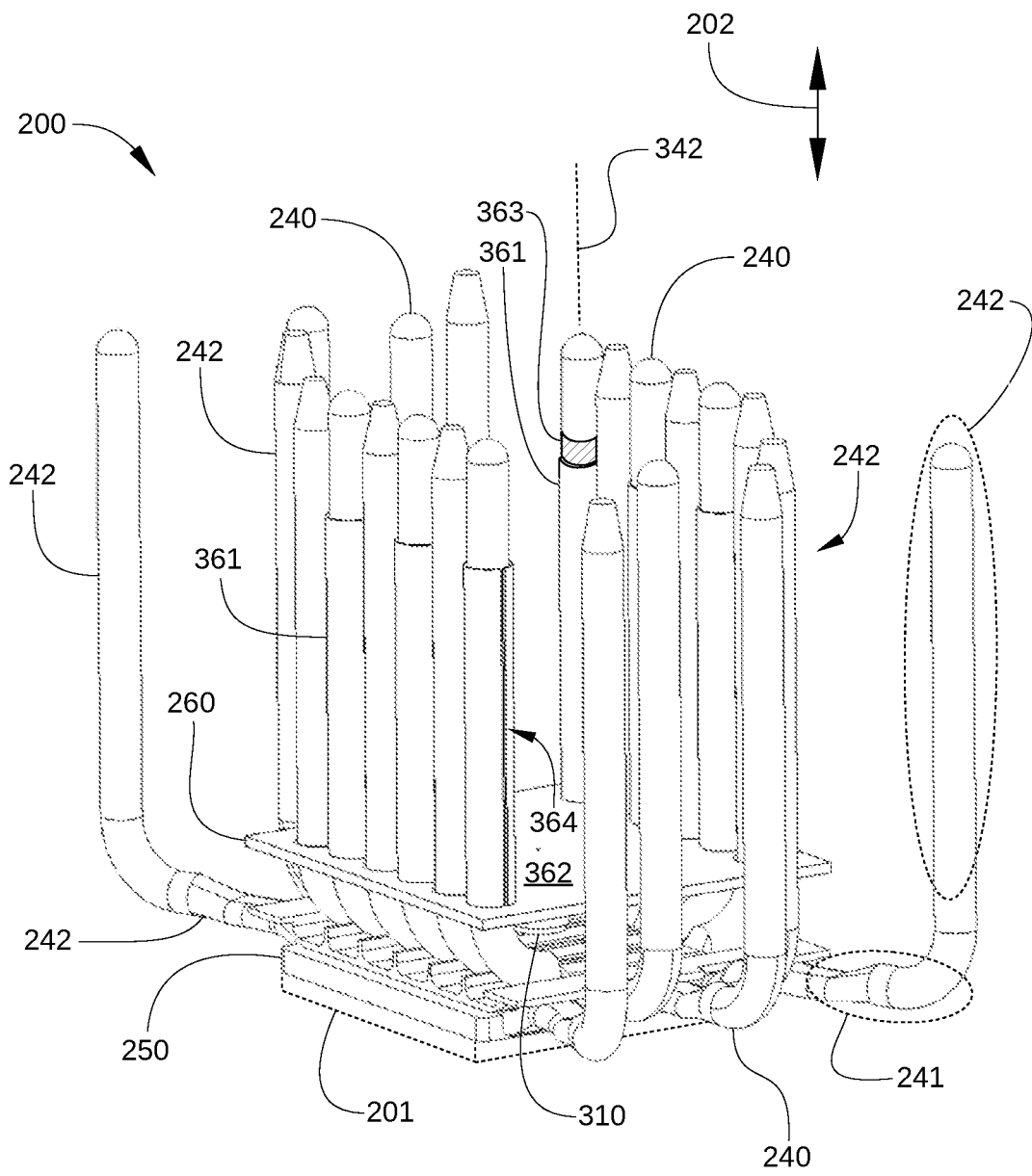
FIG. 3 is a perspective view of a movable support disposed within the heat exchanger of FIG. 2, according to various embodiments.

FIG. 3 is a perspective view of movable support 260 disposed within heat exchanger 200, according to various embodiments. In FIG. 3, movable support 260 is installed on a portion of heat pipes 240 of heat exchanger 200. For clarity, first group 231, second group 232, third group 233, and forth group 234 of cooling fins 221 are omitted in FIG. 3. Movable support 260 is configured to be coupled to a portion of the cooling fins of heat exchanger 200 in FIG. 2, such as fourth group 234. In addition, movable support 260 is configured to enable movement of that portion of the cooling fins of heat exchanger 200 in vertical direction 202. Because that portion of the cooling fins (e.g., fourth group 234) of heat exchanger 200 are all coupled to movable support 260, each of the cooling fins in that portion moves simultaneously in vertical direction 202 when movable support 260 is moved in vertical direction 202.

In the embodiment illustrated in FIG. 3, movable support 260 includes one or more columns 361 that are each mounted on or coupled to a baseplate 362. Each column is configured to fit around and slide along an axis 342 of a respective condenser portion 242 of a heat pipe 240. Thus, as baseplate 362 is actuated along vertical direction 202, the one or more columns 361 and the portion of the cooling fins that are coupled thereto move simultaneously in vertical direction 202. In some embodiments, columns 361 of movable support 260 are configured with one or more alignment features 364 that mate with a corresponding feature in the cooling fins of fourth group 234. Additionally or alternatively, in some embodiments, condenser portions 242 of heat pipes 240 are configured with one or more alignment features 342 that mate with a corresponding feature in the cooling fins of first group 231, second group 232, and/or third group 233.

Movable support 260 is further configured to be in thermal contact with one or more of condenser portions 242. Specifically, each column 361 is in thermal contact with a corresponding condenser portion 242, thereby facilitating heat transfer into each column 361 from the corresponding condenser portion 242. In some embodiments, thermal contact is enhanced between each column 361 and the corresponding condenser portion 242 via a thermally conductive material 363 that is disposed between each column 361 and corresponding condenser portion 242. In such embodiments, the thermally conductive material 363 may be selected to further act as a lubricant that facilitates relative motion between each column 361 and corresponding condenser portion 242. Examples of a material suitable for use as thermally conductive material 363 include graphite-based thermal paste, some other graphite-based material, or a thermal grease. In FIG. 3, only a visible portion of thermally conductive material 363 disposed on a surface of condenser portion 242 is shown (indicated by cross-hatching).

For causing motion of movable support 260 in vertical direction 202, movable support 260 is coupled to one or more actuators 310. In some embodiments, the one or more actuators 310 are disposed between movable support 260 and metallic plate 250 or within metallic plate 250. In other embodiments, the one or more actuators 310 may be placed in a different position on or within heat exchanger 200. The one or more actuators 310 can be any technically feasible actuators, including mechanical actuators, thermal actuators, electromechanical actuators, or the like.

In some embodiments, the one or more actuators 310 are configured to move movable support 260 to a set position relative to IC 201 and/or to the one or more condenser portions 242. For example, in one such embodiment, actuator 310 is a screw-based or other mechanical actuator that can be adjusted to a specific position manually during assembly and/or manufacturing of heat exchanger 200. In such embodiments, heat exchanger 200 can be changed from an upstream heat exchanger configuration to a downstream heat exchanger configuration (or vice versa), depending on the targeted application of heat exchanger 200. One such embodiment is illustrated in FIGS. 4A and 4B.

Figures 4A, 4B:
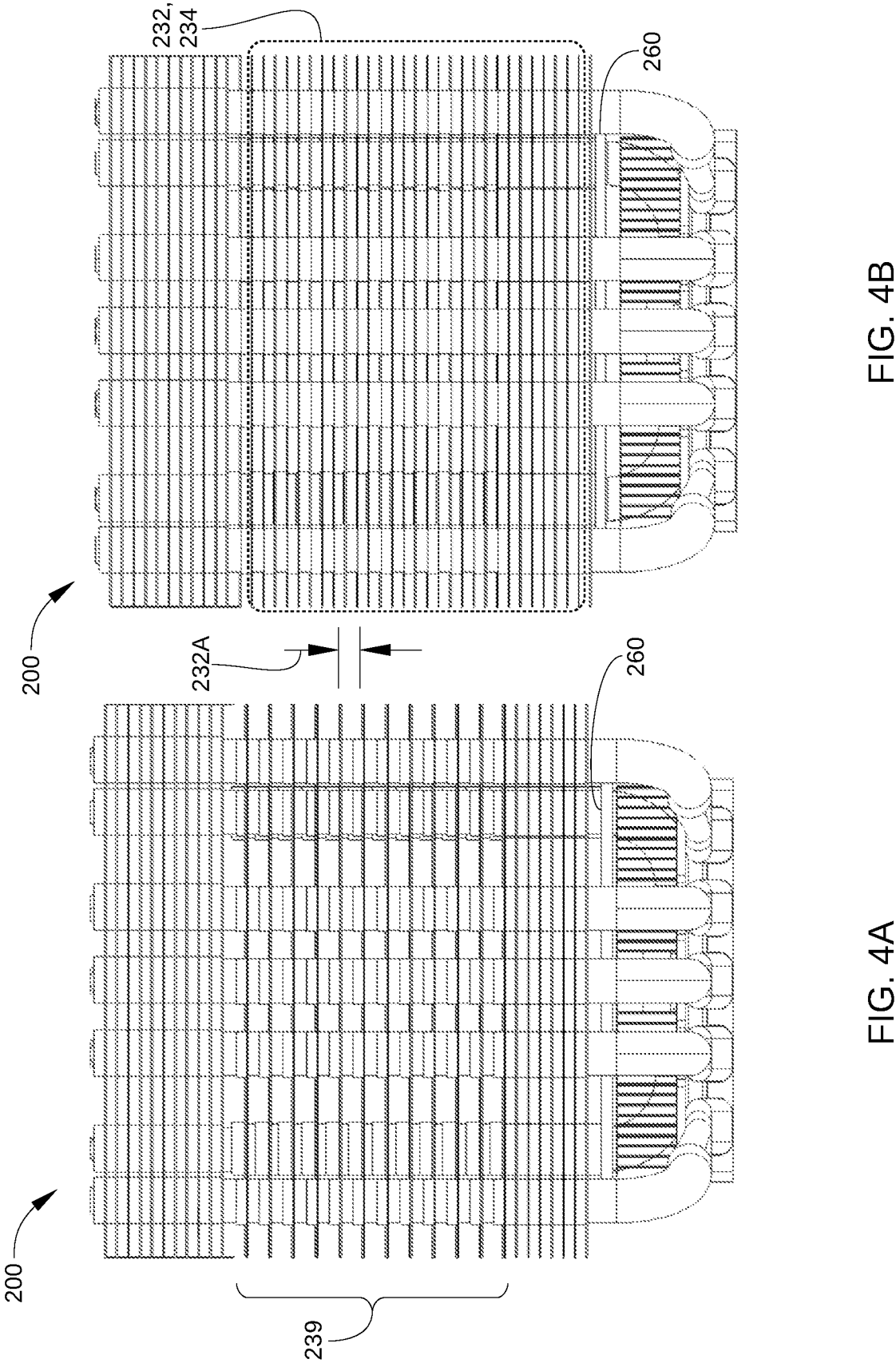
FIG. 4A is an end view of the heat exchanger of FIG. 2 in an upstream heat exchanger configuration, according to various embodiments.
FIG. 4B is an end view of the heat exchanger of FIG. 2 in a downstream heat exchanger configuration, according to various embodiments.

FIG. 4A is an end view of heat exchanger 200 in an upstream heat exchanger configuration, according to various embodiments, and FIG. 4B is an end view of heat exchanger 200 in a downstream heat exchanger configuration, according to various embodiments. As shown in FIG. 4A, heat exchanger 200 is configured to be in an upstream heat exchanger configuration, in which cooling fins coupled to movable support 260 are adjusted to each be in contact with one of the stationary cooling fins of heat exchanger 200. When the cooling fins coupled to movable support 260 are so adjusted, the effective fin pitch of center region 239 is increased to that of fixed fin pitch 232A, thereby removing the added cooling capability associated with the cooling fins of group 234 that are coupled to movable support 260. Conversely, in FIG. 4B, heat exchanger 200 is configured to be in a downstream heat exchanger configuration, in which cooling fins coupled to movable support 260 are adjusted to each be disposed at a specified position relative to the stationary cooling fins of heat exchanger 200. For example, in the embodiment illustrated in FIG. 4B, the specified position for each cooling fin coupled to movable support 260 is a position that is equidistant from the two adjacent stationary cooling fins of second group 232.

Returning to FIG. 3, in some embodiments, the one or more actuators 310 are configured to move movable support 260 to a set position relative to IC 201 and/or to the one or more condenser portions 242 as a function of a temperature associated with IC 201. In such embodiments, as the temperature associated with IC 201 changes, the one or more actuators 310 adjust the position of movable support 260 accordingly. Thus, in contrast to the embodiment illustrated in FIGS. 4A and 4B, the one or more actuators 310 are configured to adjust the position of movable support 260 in vertical direction 202 across a continuum of locations.

In some embodiments, the one or more actuators 310 include a thermomechanical actuator that generates motion of the first movable support in response to a change of the temperature associated with IC 201. Examples of thermomechanical actuators suitable for use as an actuator 310 include a bimetallic strip or other member that changes shape with temperature and a wax-based thermal actuator (such as a diaphragm- or piston-type thermal actuator). In wax-based thermal actuator, an actuator 310 includes a thermally actuated mechanism, such as a reservoir of wax, that expands when heated and contracts when cooled. As a temperature of the reservoir of wax changes, a piston attached to the reservoir and to movable support 260 moves along a particular axis of linear motion, such as vertical direction 202. In this way, an actuator 310 moves movable support 260 in response to a change in a temperature of the reservoir of wax, which is caused by a change in temperature of IC 201. Thus, the actuator 310 implements a thermally controlled movement based on the temperature of IC 201.

In some embodiments, the one or more actuators 310 include an electronically controlled actuator, such as an electric motor coupled and a controller that controls the electric motor. In such embodiments, the electric motor is coupled to a mechanical actuator, such as a piston, that is attached to movable support 260. In response to receiving a signal indicating a temperature associated with IC 201, the controller causes the actuator to move movable support 260 in vertical direction 202. In such embodiments, the signal indicating the temperature associated with IC 201 may be generated by IC 201 itself or by a temperature sensor included in or proximate to adjustable heat sink 220. In some embodiments, multiple inputs may be employed to generate the signal indicating the temperature associated with IC 201, such as a processor temperature and a fan speed. In such embodiments, a suitable algorithm based on the multiple inputs and/or the signal indicating the temperature associated with IC 201 can be employed by the controller to determine an amount of actuation of the electric motor.

In some embodiments, the controller for the one or more actuators 310 can be integrated in the one or more actuators 310, included in heat exchanger 200, or implemented as one of electronic components 104 (shown in FIG. 1) mounted on PCB 102. In some embodiments, the controller for the one or more actuators 310 can be configured to control similar actuators included in other similar heat exchangers included in the same computer system. For example, in one such embodiment, the controller can control the one or more actuators for each of upstream heat exchangers 103A and downstream heat exchangers 103B in computer system 100 of FIG. 1.

Cooling Fins for Adjustable Heat Sink

Figures 5A, 5B, 5C:
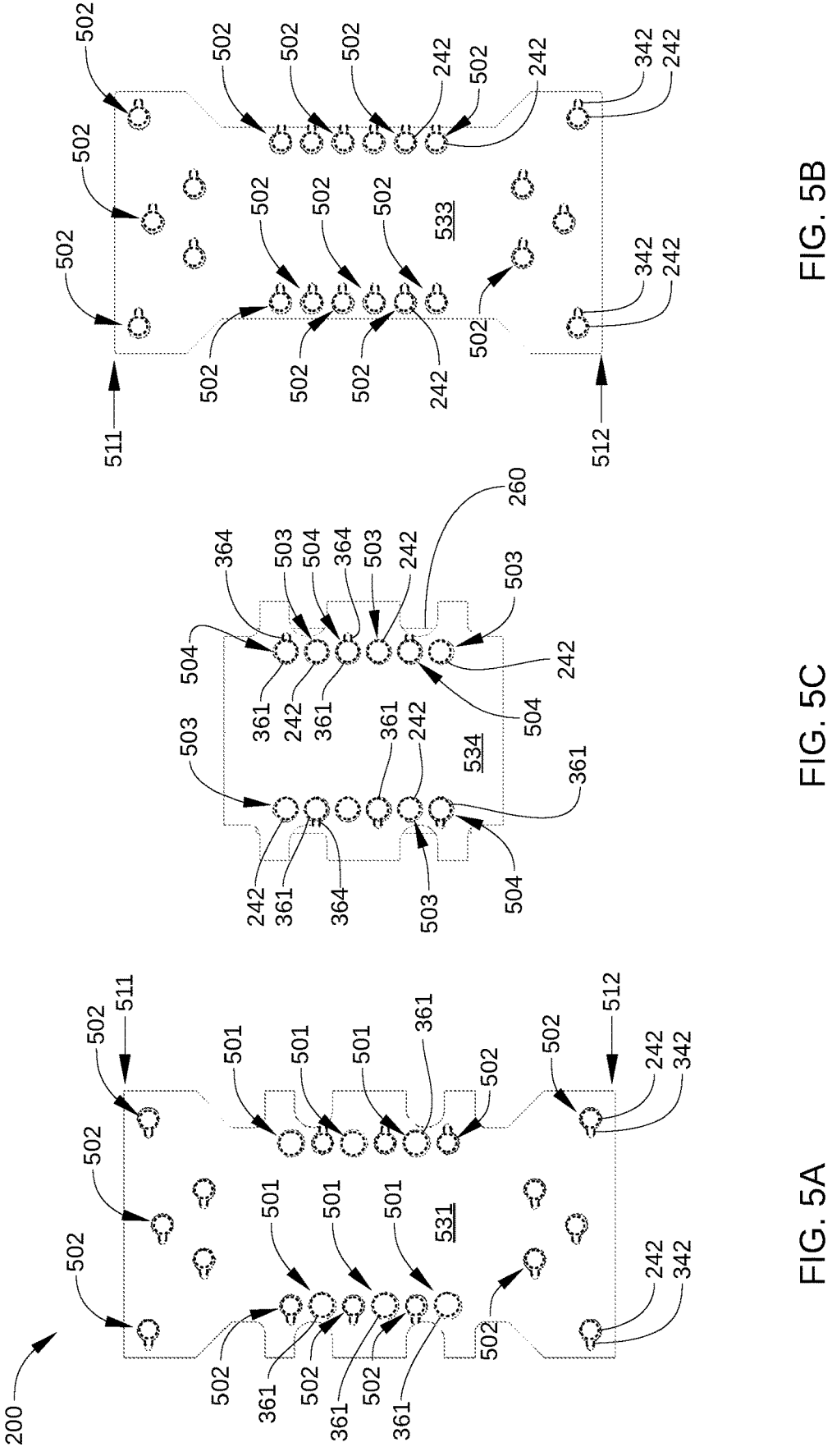
FIGS. 5A-5C illustrate various cooling fins included in the adjustable heat exchanger of FIG. 2, according to various embodiments.

FIGS. 5A-5C illustrate various cooling fins 221 included in adjustable heat sink 220, according to various embodiments. FIG. 5A shows a representative cooling fin 531 that is included in first group 231 and second group 232 of cooling fins 221, FIG. 5B shows a representative cooling fin 533 that is included in third group 233 of cooling fins 221, and FIG. 5C shows a representative cooling fin 534 that is included in fourth group 234 of cooling fins 221. For reference, the locations of condenser portions 242, alignment features 342, columns 361, and alignment features 364 are indicated in FIGS. 5A-5C as dashed lines.

As shown in FIG. 5A, representative cooling fin 531 generally has openings 501 configured to allow movement of columns 361 relative to representative cooling fin 531. Representative cooling fin 531 further includes openings 502 configured to mechanically couple representative cooling fin 531 to one or more condenser portions 242 when representative cooling fin 531 is installed in heat exchanger 200. For example, each opening 502 may be configured to couple to a condenser portion 242 and an alignment feature 342 formed thereon. In the embodiment illustrated in FIG. 5A, representative cooling fin 531 extends from a first cooling air receiving edge 511 to a second air receiving edge 512. That is, to maximize or otherwise increase the heat transfer capacity of representative cooling fin 531, representative cooling fin 531 is mechanically coupled to all of heat pipes 240 of heat exchanger 200 and has a surface area that is as large as practicable. As a result, representative cooling fin 531 has a greater surface area than representative cooling fin 534.

As shown in FIG. 5B, representative cooling fin 533 generally has openings 502 configured to mechanically couple representative cooling fin 533 to one or more condenser portions 242 when representative cooling fin 531 is installed in heat exchanger 200. For example, each opening 502 may be configured to couple to a condenser portion 242 and an alignment feature 342 formed thereon. In the embodiment illustrated in FIG. 5B, representative cooling fin 533 extends from first cooling air receiving edge 511 to second air receiving edge 512, and therefore has a greater surface area than representative cooling fin 534.

As shown in FIG. 5C, representative cooling fin 534 generally has openings 503 configured to allow movement of condenser portions 242 relative to representative cooling fin 534. Representative cooling fin 534 further includes openings 504 configured to mechanically couple representative cooling fin 532 to one or more columns 361 when representative cooling fin 534 is installed in heat exchanger 200. For example, each opening 504 may be configured to couple to a column 361 and an alignment feature 364 formed thereon. In the embodiment illustrated in FIG. 5C, representative cooling fin 534 has a smaller surface area than representative cooling fin 531. In other embodiments, representative cooling fin 533 has a similar surface area to representative cooling fin 531, and extends from first cooling air receiving edge 511 to second air receiving edge 512.

Figure 6:
FIG. 6 is a perspective view of the heat exchanger of FIG. 2 when partially assembled, according to various embodiments.
Figure 6:
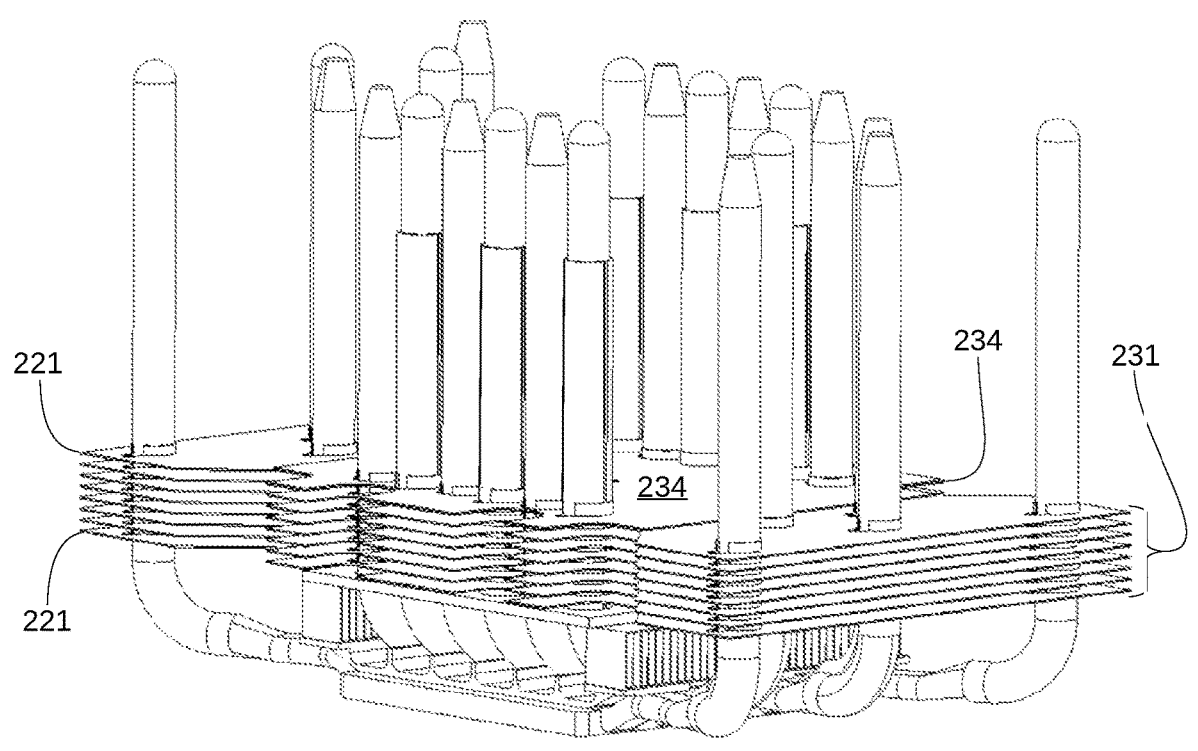

FIG. 6 is a perspective view of heat exchanger 200 when partially assembled, according to various embodiments. In FIG. 6, the cooling fins 221 of first group 231 and one of the adjustable cooling fins 221 of fourth group 234 are installed in heat exchanger 200. In the embodiment illustrated in FIG. 6, the placement order in center region 239 of heat exchanger 200 alternates between adjustable cooling fins 221 of fourth group 234 and stationary cooling fins of second group 232.

In the embodiments described above in conjunction with FIGS. 1-6, a single group of adjustable cooling fins can be repositioned via a movable support. In other embodiments, an adjustable heat sink includes multiple groups of adjustable cooling fins, where each group of adjustable cooling fins is mechanically coupled to a different movable support. One such embodiment is described below in conjunction with FIG. 7.

Figure 7:
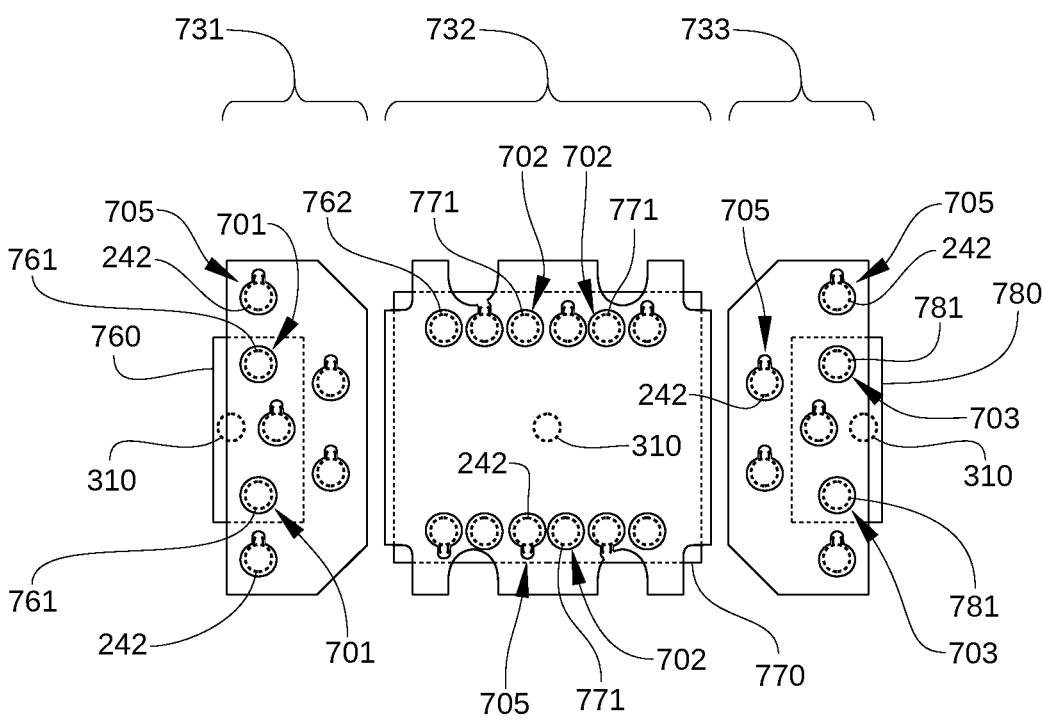
FIG. 7 illustrates various cooling fins that are each included in a different group of adjustable cooling fins that can be implemented in an adjustable heat sink, according to various embodiments.

FIG. 7 illustrates various cooling fins 221 that are each included in a different group of adjustable cooling fins of an adjustable heat sink 700, according to various embodiments. FIG. 7 shows a representative cooling fin 731 that is included in a first group of adjustable cooling fins, a representative cooling fin 732 that is included in a second group of adjustable cooling fins, and a representative cooling fin 733 that is included in a third group of adjustable cooling fins. For reference, the locations of condenser portions 242 and columns 761, 771, and 781, are indicated in FIG. 7 as dashed lines. In addition, adjustable heat sink 700 includes a first movable support 760 (mechanically coupled to representative cooling fin 731), a second movable support 770 (mechanically coupled to representative cooling fin 732), and a third movable support 780 (mechanically coupled to representative cooling fin 733).

Representative cooling fins 731-733 each include openings 705 configured to allow movement of representative cooling fins 731-733 relative to condenser portions 242. Representative cooling fin 731 further includes openings 701 configured to mechanically couple representative cooling fin 731 to one or more columns 761 of first movable support 760 when representative cooling fin 731 is installed in adjustable heat sink 700. Similarly, representative cooling fin 732 further includes openings 702 configured to mechanically couple representative cooling fin 732 to one or more columns 771 of second movable support 770 when representative cooling fin 732 is installed in adjustable heat sink 700, and representative cooling fin 733 further includes openings 703 configured to mechanically couple representative cooling fin 733 to one or more columns 781 of third movable support 780 when representative cooling fin 733 is installed in adjustable heat sink 700.

Similar to movable support 260 in FIG. 2, first movable support 760 is coupled to one or more actuators 310, second movable support 770 is coupled to one or more actuators 310, and third movable support 780 is coupled to one or more actuators 310. As a result, first movable support 760, second movable support 770, and third movable support 780 can each be independently moved relative to condenser portions 242, for example as a function of a temperature associated with an IC coupled to adjustable heat sink 700. Thus, in the embodiment illustrated in FIG. 7, the group of cooling fins that includes representative cooling fin 731 can be repositioned independently from the group of cooling fins that includes representative cooling fin 732 and from the group of cooling fins that includes representative cooling fin 733. As a result, one or more actuators 310 can be configured to move first movable support 760 and the group of cooling fins that includes representative cooling fin 731 when a temperature is within a first temperature range, one or more actuators 310 can be configured to move second movable support 770 and the group of cooling fins that includes representative cooling fin 732 when the temperature is within a second temperature range, and one or more actuators 310 can be configured to move third movable support 780 and the group of cooling fins that includes representative cooling fin 733 when the temperature is within a third temperature range.

In some embodiments, the first, second, and third temperature ranges can be overlapping temperature ranges or non-overlapping temperature ranges. In either case, when a heat exchanger includes multiple movable supports that can each be independently moved, the cooling efficiency of adjustable heat sink 700 can be varied continuously over multiple temperature ranges.

Controlling an Adjustable Heat Sink

Figure 8:
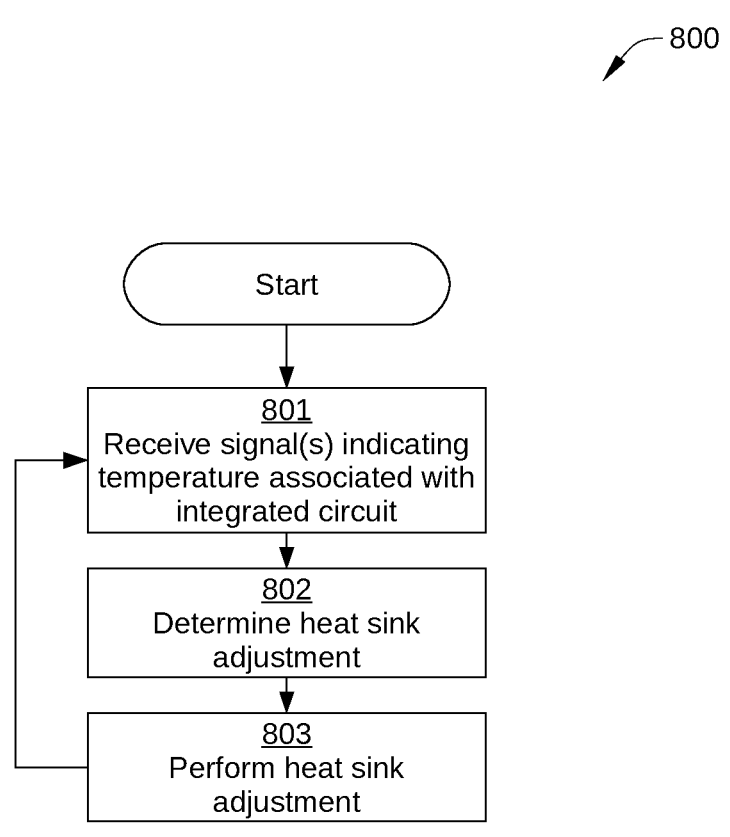
FIG. 8 is a flowchart of method steps for controlling an adjustable heat sink, according to various embodiments.

FIG. 8 is a flowchart of method steps for controlling cooling efficiency in an adjustable heat sink, according to various embodiments. Although the method steps are described in conjunction with the systems of FIGS. 1-7, persons skilled in the art will understand that any system configured to perform the method steps, in any order, is within the scope of the present invention.

As shown, a method 800 begins at step 801, where a suitable controller receives one or more signals indicating a temperature associated with IC 201. In some embodiments, at least one such signal is generated by IC 201 itself. Alternatively, in some embodiments at least one such signal is generated by a temperature sensor included in or proximate to heat sink 201. In some embodiments, at least one such signal is generated by a component of computer system 100, such as a fan that generates a fan speed signal, a temperature sensor that measures a temperature of a portion of computer system 100 proximate IC 201, and/or a heat exchanger that is upstream or downstream of IC 201.

In step 802, the controller determines a heat sink adjustment to be made, if any, based on the one or more signals received in step 801. In some embodiments, the heat sink adjustment is determined based on a signal indicating a temperature of IC 201. Additionally or alternatively, in some embodiments the heat sink adjustment is determined based on a signal indicating a temperature associated with a heat exchanger that is upstream or downstream of IC 201. For example, in one such embodiment, when a downstream heat exchanger (or IC associated with the downstream heat exchanger) exceeds a threshold temperature value, the controller determines a heat sink adjustment to adjustable heat sink 220 that reduces the cooling efficiency of heat sink 220, reduces the temperature of cooling air exiting heat sink 220, and increases the heat transfer capability of the downstream heat exchanger.

Additionally or alternatively, in some embodiments the heat sink adjustment is determined based on multiple signals that each indicate or are associated with a temperature of a different IC than IC 201. For example, in one such embodiment, the controller determines a heat sink adjustment to adjustable heat sink 220 based on a first temperature of or associated with IC 201, a second temperature of or associated with a heat exchanger in computer system 100 that is upstream of IC 201, and/or a third temperature of or associated with a heat exchanger in computer system 100 that is downstream of IC 201.

In some embodiments, the controller controls the adjustment of multiple adjustable heat exchangers 220 included in computer system 100. In such embodiments, in step 802 the controller also determines in which adjustable heat sink 220 the adjustment is to be made, if any.

In step 803, in response to the signal received in step 801 and/or to the heat sink adjustment determined in step 802, the controller causes one or more actuators 310 to move a movable support, e.g., movable support 260, relative to condenser portions 242 and/or IC 201. In this way, the cooling efficiency of one or more adjustable heat sinks is modified in response to a temperature change in one or more ICs included in computer system 100.

In sum, the various embodiments shown and provided herein set forth an adjustable heat sink for an integrated circuit. The adjustable heat sink is configured with one or more groups of movable cooling fins that, when moved relative to stationary cooling fins included in the adjustable heat sink, modify the effective cooling efficiency of the adjustable heat sink. Because the cooling efficiency of the adjustable heat sink is not fixed, the same heat sink can be employed in an upstream heat exchanger and a downstream heat exchanger. Further, in some embodiments, the adjustable heat sink is configured with a controllable actuator that enables dynamic control of the cooling efficiency of the adjustable heat sink.

At least one technical advantage of the disclosed approach relative to the prior art is that the disclosed approach results in more efficient cooling of an electronic device that is disposed within a computer system downstream of an adjustable heat sink. More specifically, when the adjustable heat sink is coupled to an upstream electronic device within the computer system, the cooling efficiency of the adjustable heat sink can be reduced, causing the temperature of cooling air exiting the adjustable heat sink to decrease. As that relatively cooler air passes over a downstream electronic device within the computer system, the downstream device is cooled relatively more effectively. Thus, the adjustable heat sink can selectively modify the efficiency of cooling of the upstream electronic device relative to that of the downstream electronic device. Since the adjustable heat sink can be employed in a computer system as both an upstream heat sink and as a downstream heat sink, the manufacturing process for the computer system is simplified. Further, in operation, the adjustable heat sink provides flexibility in the placement or orientation within a computer system of a processor board that includes upstream and downstream heat-generating electronic devices. These technical advantages provide one or more technological advancements over prior art approaches.

1. In some embodiments, an apparatus comprises at least one heat pipe that is adapted to be thermally coupled to an integrated circuit and has an evaporator portion and a first condenser portion, wherein the first condenser portion extends away from the evaporator portion; a first plurality of cooling fins that is attached to the first condenser portion; a first movable support that is thermally coupled to the first condenser portion and is configured to move a second plurality of cooling fins relative to the first plurality of cooling fins; and the second plurality of cooling fins, which is attached to the first movable support.

2. The apparatus of clause 1, wherein the first movable support is configured to slide along an axis of the at least one heat pipe to move the second plurality of cooling fins relative to the first plurality of cooling fins.

3. The apparatus of clause 1 or 2, wherein the first movable support is configured to move a cooling fin in the second plurality of cooling fins from a first position between two cooling fins in the first plurality of cooling fins to a second position between the two cooling fins in the first plurality of cooling fins.

4. The apparatus of any of clauses 1-3, wherein the first movable support is configured to simultaneously move each cooling fin in the second plurality of cooling fins from a respective first position to a respective second position.

5. The apparatus of any of clauses 1-4, wherein each cooling fin in the first plurality of cooling fins has a first shape, each cooling fin in the second plurality of cooling fins has a second shape, and the first shape is different than the second shape.

6. The apparatus of any of clauses 1-5, wherein the first shape has a larger surface area than the second shape.

7. The apparatus of any of clauses 1-6, further comprising an actuator configured to move the first movable support relative to the first condenser portion.

8. The apparatus of any of clauses 1-7, wherein the actuator is configured to move the first movable support to a set position relative to the first condenser portion.

9. The apparatus of any of clauses 1-8, wherein the actuator is configured to move the first movable support relative to the first condenser portion based on a temperature associated with the integrated circuit.

10. The apparatus of any of clauses 1-9, wherein the actuator comprises a thermomechanical actuator that moves the first movable support in response to a change of the temperature.

11. The apparatus of any of clauses 1-10, further comprising a controller configured to receive a signal indicating a temperature associated with the integrated circuit, and, in response to the signal, cause an actuator to move the first movable support relative to the first condenser portion.

12. The apparatus of any of clauses 1-11, wherein the signal is generated by one of the integrated circuit or a temperature sensor included within an electronic device along with the integrated circuit.

13. The apparatus of any of clauses 1-12, further comprising: a third plurality of cooling fins; and a second movable support that is mechanically coupled to the third plurality of cooling fans and thermally coupled to a second condenser portion of a heat pipe of the heat exchanger and is configured to move the third plurality of cooling fins relative to the first plurality of cooling fins.

14. The apparatus of any of clauses 1-13, further comprising a first actuator configured to move the first movable support relative to the first condenser portion, and a second actuator configured to move the second movable support relative to the second condenser portion.

15. The apparatus of any of clauses 1-14, wherein first the actuator is configured to move the first movable support relative to the first condenser portion based on a temperature associated with the integrated circuit and the second actuator is configured to move the second movable support relative to the second condenser portion based on the temperature.

16. The apparatus of any of clauses 1-15, wherein the first the actuator is configured to move the first movable support relative to the first condenser portion when the temperature is within a first temperature range, and the second actuator is configured to move the second movable support relative to the second condenser portion when the temperature is within a second temperature range.

17. In some embodiments, a method of controlling an adjustable heat sink comprises: receiving one or more signals indicating a temperature associated with a first integrated circuit; based on the one or more signals, determining a heat sink adjustment to be made; and causing an actuator to perform the heat sink adjustment.

18. The method of clause 17, wherein causing the actuator to perform the heat sink adjustment comprises causing the actuator to move a movable support that is mechanically coupled to a first plurality cooling fins in the adjustable heat sink relative to a second plurality of fins in the adjustable heat sink.

19. The method of clause 17 or 18, wherein the adjustable heat sink is thermally coupled to a second integrated circuit that is upstream of the first integrated circuit when a computing device that includes the first integrated circuit and the second integrated circuit is in operation.

20. In some embodiments, a computer system comprises: a first integrated circuit; a second integrated circuit that is disposed downstream relative to the first integrated circuit with respect to a cooling airflow when the computing system is in operation; and an adjustable heat exchanger that includes: at least one heat pipe that is adapted to be thermally coupled to the first integrated circuit and has an evaporator portion and a condenser portion, wherein the condenser portion extends away from the evaporator portion; a first plurality of cooling fins that is attached to the condenser portion; a second plurality of cooling fins; and a first movable support that is mechanically coupled to the second plurality of cooling fins and thermally coupled to the condenser portion and is configured to move the second plurality of cooling fins relative to the first plurality of cooling fins.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

While the preceding is directed to embodiments of the present disclosure, other and further embodiments of the disclosure may be devised without departing from the basic scope thereof, and the scope thereof is determined by the claims that follow.

What is claimed is:

1. A method of controlling an adjustable heat sink, the method comprising:

receiving one or more signals that indicate at least one temperature associated with at least one aspect of a computer system in which the adjustable heat sink resides;

based on the one or more signals, determining an adjustment to be made to the adjustable heat sink, wherein the adjustment modulates a space maintained between a first plurality of stationary cooling fins and a second plurality of adjustable cooling fins when the adjustable heat sink receives airflow; and causing an actuator to perform the adjustment.

2. The method of claim 1, wherein causing the actuator to perform the adjustment comprises causing the actuator to move a movable support that is mechanically coupled to a first plurality cooling fins included in the adjustable heat sink relative to a second plurality of fins included in the adjustable heat sink.

3. The method of claim 1, wherein the adjustable heat sink is thermally coupled to a first integrated circuit that resides upstream of a second integrated circuit within the computer system, wherein both the first integrated circuit and the second integrated circuit reside within the computer system.

4. The method of claim 1, wherein at least one of the one or more signals is generated by a first integrated circuit that resides within the computer system.

5. The method of claim 1, wherein at least one of the one or more signals is generated by temperature sensor that resides within the computer system.

6. The method of claim 1, wherein at least one of the one or more signals is generated by at least one of a fan that resides within the computer system and generates a fan speed signal, a temperature sensor that resides within the computer system and measures a temperature of a portion of the computer system proximate to a first integrated circuit, or a heat exchanger that resides upstream or downstream of the first integrated circuit within the computer system.

7. The method of claim 1, wherein at least one of the one or more signals indicates a temperature associated with a heat exchanger that resides upstream or downstream of a first integrated circuit within the computer system.

8. The method of claim 7, wherein the heat exchanger resides downstream of the first integrated circuit, and the temperature associated with the heat exchanger exceeds a threshold value, and the adjustment reduces a cooling efficiency associated with the adjustable heat sink.

9. The method of claim 1, wherein at least one of the one or more signals indicates at least one of a first temperature associated with a first integrated circuit that resides within the computer system, a second temperature associated with a heat exchanger that resides upstream of the first integrated circuit within the computer system, or a third temperature associated with a heat exchange that resides downstream of the first integrated circuit within the computer system.

\* \* \* \* \*